(12) United States Patent
Yamaji et al.

(10) Patent No.: US 11,983,603 B2
(45) Date of Patent: May 14, 2024

(54) HOLDER, QUANTUM DEVICE, AND MANUFACTURING METHOD OF QUANTUM DEVICE

(71) Applicant: NEC Corporation, Tokyo (JP)

(72) Inventors: Tomohiro Yamaji, Tokyo (JP); Hideyuki Satou, Tokyo (JP); Yoshihito Hashimoto, Tokyo (JP); Aiko Uchiyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 373 days.

(21) Appl. No.: 17/375,943

(22) Filed: Jul. 14, 2021

(65) Prior Publication Data

US 2022/0036229 A1    Feb. 3, 2022

(30) Foreign Application Priority Data

Jul. 31, 2020    (JP) .................................. 2020-130625

(51) Int. Cl.
*G06N 10/00* (2022.01)
*G06F 1/20* (2006.01)

(52) U.S. Cl.
CPC .............. *G06N 10/00* (2019.01); *G06F 1/20* (2013.01)

(58) Field of Classification Search
USPC ........................................................ 716/100
See application file for complete search history.

(56) References Cited

U.S. PATENT DOCUMENTS

| 2010/0157552 | A1* | 6/2010 | Thom | H01F 41/048 336/200 |
| 2014/0319656 | A1* | 10/2014 | Marchena | H01S 5/02326 438/106 |
| 2022/0036229 | A1* | 2/2022 | Yamaji | G06N 10/40 |

FOREIGN PATENT DOCUMENTS

JP    2000-216172 A    8/2000

OTHER PUBLICATIONS

B. Lienhard, et. al., Microwave Packaging for Superconducting Qubits, arXiv:1906.05425v1 [quant-ph], Jun. 12, 2019.

* cited by examiner

*Primary Examiner* — Mohammed Alam
(74) *Attorney, Agent, or Firm* — Sughrue Mion, PLLC

(57) ABSTRACT

A quantum device includes a quantum chip and a holder. The holder includes a pedestal, a recess portion formed in a main surface of the pedestal so as to be opposed to the quantum chip, and a suction tube provided such that in the recess portion, a suction opening is positioned in a bottom surface of the quantum chip.

4 Claims, 11 Drawing Sheets

HOLDER, QUANTUM DEVICE, AND MANUFACTURING METHOD OF QUANTUM DEVICE

INCORPORATION BY REFERENCE

This application is based upon and claims the benefit of priority from Japanese patent application No. 2020-130625, filed on Jul. 31, 2020, the disclosure of which is incorporated herein in its entirety by reference.

TECHNICAL FIELD

The present disclosure relates to a holder, a quantum device, and a manufacturing method of a quantum device.

BACKGROUND ART

In general, a superconducting circuit configuring a quantum computer is implemented in a quantum chip including a superconductor and an insulator on which the superconductor is deposited. Then, the quantum chip is housed in a holder formed of metal so that the quantum chip is not subject to an external electromagnetic disturbance. In this case, the quantum chip is fixed to the holder by an adhesive or the like, and a signal line of the quantum chip is electrically connected with a waveguide provided on the holder (or a waveguide included in a PCB provided on the holder) by a bonding wire or the like.

However, in such a structure, there has been a problem that because a capacitor is formed with a metal surface of a holder contacting with a quantum chip and a superconductor formed in the quantum chip, an internal Q factor decreases due to dielectric loss or box resonance occurs. In other words, in such a structure, there has been a problem that quality of a quantum chip decreases.

A solution to such a problem is disclosed in B. Lienhard, et. al., arXiv: 1906.05425v1 [quant-ph] 12 Jun. 2019, Microwave Packaging for Superconducting Qubits, for example. B. Lienhard, et. al., arXiv: 1906.05425v1 [quant-ph] 12 Jun. 2019, Microwave Packaging for Superconducting Qubits discloses that metal surfaces other than metal surfaces supporting four corners of a quantum chip in metal surfaces of a holder opposed to a superconductor formed in the quantum chip are reduced by a counterbore treatment. Because the counterbore treatment inhibits formation of a capacitor with metal surfaces of the holder contacting with the quantum chip and the superconductor formed in the quantum chip, the internal Q factor can be prevented from decreasing due to the dielectric loss, and the box resonance can be prevented from occurring.

However, a structure in B. Lienhard, et. al., arXiv: 1906.05425v1 [quant-ph] 12 Jun. 2019, Microwave Packaging for Superconducting Qubits, the quantum chip might fall into a space region formed by the counterbore treatment or might slantingly be arranged. In other words, there has been a problem that in the structure in B. Lienhard, et. al., arXiv: 1906.05425v1 [quant-ph] 12 Jun. 2019, Microwave Packaging for Superconducting Qubits, it is difficult to secure stability of the quantum chip.

A solution to such a problem is disclosed in Japanese Unexamined Patent Application Publication No. 2000-216172, for example. Japanese Unexamined Patent Application Publication No. 2000-216172 discloses a bonding stage provided with a vacuum adhesion hole opening in a chip installation surface. This bonding stage performs vacuum adhesion via the vacuum adhesion hole by using a vacuum pump and thereby fixes a chip installed on the chip installation surface.

In a structure in Japanese Unexamined Patent Application Publication No. 2000-216172, there has been a problem that because a capacitor is formed with surrounding metal forming the vacuum adhesion hole and a superconductor formed in a quantum chip, the internal Q factor still decreases due to the dielectric loss or the box resonance still occurs. In other words, Unexamined Patent Application Publication No. 2000-216172 has a problem that quality of a quantum chip still decreases.

SUMMARY

One of objects of the present disclosure is to provide a holder, a quantum device, and a manufacturing method of a quantum device that solve the above-described problems.

In one example embodiment, a quantum device includes: a quantum chip; and a holder, in which the holder includes: a pedestal; a recess portion formed in a main surface of the pedestal so as to be opposed to the quantum chip; and a tube provided such that in the recess portion, an opening portion is positioned in a bottom surface of the quantum chip.

In one example embodiment, a holder includes: a pedestal; a recess portion formed in a main surface of the pedestal so as to be opposed to a quantum chip; and a tube provided such that in the recess portion, an opening portion is positioned in a bottom surface of the quantum chip.

In one example embodiment, a manufacturing method of a quantum device includes: a step of mounting a suction tube on a pedestal such that a suction opening is positioned in a bottom surface of a quantum chip in a recess portion formed in a main surface of the pedestal; a step of arranging the quantum chip on a main surface of the pedestal such that the quantum chip is opposed to the recess portion; a step of performing suction of the quantum chip via the suction tube to adhere the quantum chip to the suction opening of the suction tube; a step of electrically connecting a signal line of the quantum chip with a waveguide arranged in the pedestal; and a step of removing the suction tube from the pedestal.

BRIEF DESCRIPTION OF DRAWINGS

The above and other aspects, features and advantages of the present disclosure will become more apparent from the following description of certain exemplary embodiments when taken in conjunction with the accompanying drawings, in which.

EXAMPLE EMBODIMENTS

Figure 1:
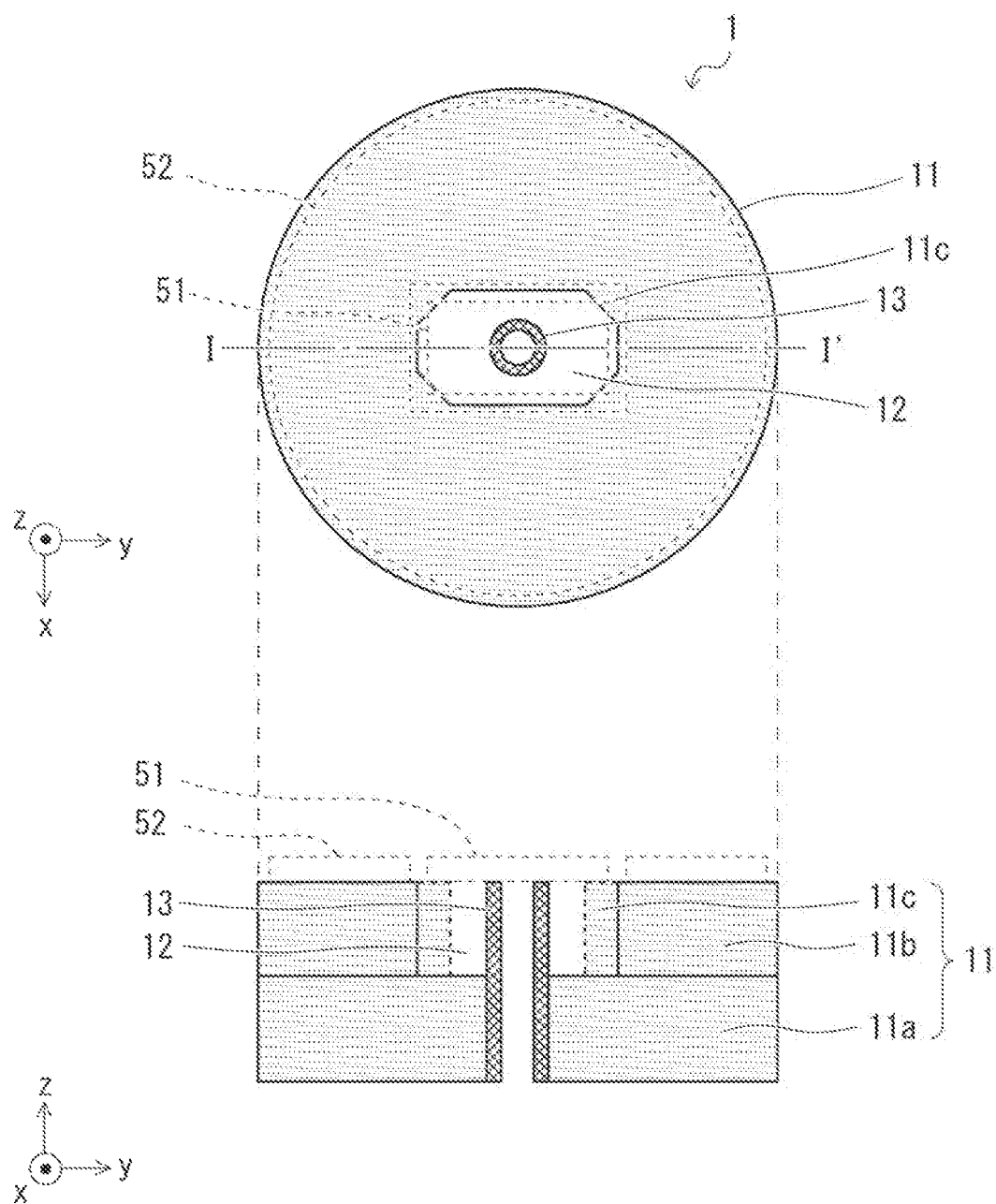
FIG. 1 is an outline planar view and an outline cross-sectional view that illustrate one example of a holder according to a first example embodiment.

Hereinafter, example embodiments will be described with reference to drawings. Note that because the drawings are simplified, the technical scope of the example embodiments should not narrowly be interpreted based on illustrations of those drawings. Further, the same reference characters are given to the same elements, and repeated descriptions will not be made.

In the following example embodiments, descriptions will be made by dividing an example embodiment into plural sections or example embodiments when division is necessary for convenience. However, unless otherwise specified, those are not unrelated to each other, but one section or example embodiment is related with a portion or whole of another as a modification example, an application example, a detailed description, a supplementary explanation. Further, in the following example embodiments, in a case where the numbers of elements and so forth (including numbers, numerical values, amounts, ranges, and so forth) are mentioned, except a case where those are specified otherwise, a case where those are obviously limited to a specific number in principle, or the like, those are not limited to the specific number but may be equivalent to, less than, or greater than the specific number.

In addition, in the following example embodiments, configuration elements thereof (including action steps and so forth) are not necessarily essential except a case where those are specified otherwise, a case where those are obviously essential in principle, or the like. Similarly, in the following example embodiments, when shapes, positional relationships, and so forth of configuration elements are mentioned, the shapes, positional relationships, and so forth include those that are substantially approximate or similar to the shapes and so forth except a case where those are specified otherwise, a case where those are considered to be obviously not approximate or similar in principle, or the like. The same applies to the above-described numbers and so forth (including numbers, numerical values, amounts, ranges, and so forth).

In the following, quantum computing denotes a domain in which data are operated by using quantum-mechanical phenomena (quantum bit). Quantum-mechanical phenomena denote superposition of plural states (a phenomenon where a quantum variable simultaneously exhibits plural different states), entanglement (a state where plural quantum variables relate with each other regardless of space or time), and so forth. A quantum chip is provided with a quantum circuit generating quantum bits.

First Example Embodiment

FIG. 1 is an outline planar view and an outline cross-sectional view that illustrate one example of a holder 1 according to a first example embodiment. Note that the outline cross-sectional view in FIG. 1 is a cross section taken along a I-I' part in the outline planar view in FIG. 1 and seen from a lateral direction (x-axis direction).

The holder 1 is a device housing a quantum chip 51 and serves to protect the quantum chip 51 from external electromagnetic disturbance. The quantum chip 51 includes at least a superconductor and an insulator on which the superconductor is deposited and can realize action using a superconducting phenomenon by being situated under a very low temperature environment. A detailed description will be made in the following.

Note that in the following description, superconducting materials denote metal materials such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and alloys containing any of those, for example.

As illustrated in FIG. 1, the holder 1 includes at least a pedestal 11 and a suction tube 13.

The pedestal 11 has a columnar shape whose axial direction is a perpendicular direction (z-axis direction), and the quantum chip 51 or the like is capable of being arranged on an upper surface (main surface) of the pedestal 11.

In the present example, the pedestal 11 is configured with a pedestal bottom portion 11a and a pedestal upper portion 11b. The pedestal bottom portion 11a has a columnar shape whose axial direction is the perpendicular direction, and a through hole passing from a bottom surface to an upper surface is provided along a central axis of the pedestal bottom portion 11a. The suction tube 13 is capable of being inserted in this through hole. The pedestal upper portion 11b has a columnar shape whose axial direction is the perpendicular direction similarly to the pedestal bottom portion 11a and is arranged on the upper surface of the pedestal bottom portion 11a. The quantum chip 51 is capable of being arranged in a central region of an upper surface (main surface) of the pedestal upper portion 11b, and a printed circuit board (PCB) 52 including a waveguide is capable of being arranged in a peripheral region of the central region. Note that instead of the PCB 52 including the waveguide, the waveguide may directly be arranged.

The pedestal 11 is configured with a metal material having copper (Cu) or aluminum (Al) as a main component, for example. In a case where copper is used as the main component, oxygen-free copper is preferably used as the copper for prevention of magnetization. In addition, a surface of the oxygen-free copper is preferably plated with gold for prevention of oxidation. Note that gold plating can also improve adhesiveness to the PCB. Further, in a case where aluminum is used as the main component, the aluminum may be insulated by an anodizing process.

Here, a counterbore treatment is applied to an arrangement region of the quantum chip 51 in the upper surface of the pedestal 11 (the upper surface of the pedestal upper portion 11b). In other words, a recess portion (space region) 12 in a recessed shape is formed in the arrangement region of the quantum chip 51 in the upper surface of the pedestal 11.

In the present example, the recess portion 12 is formed from an opposed surface to the upper surface of the pedestal upper portion 11b in a region including a central axis of the pedestal upper portion 11b while being continuous with the through hole of the pedestal bottom portion 11a. Further, the recess portion 12 is formed such that in a planar view, a formation region of the recess portion 12 does not include a portion of the arrangement region of the quantum chip 51 (in other words, such that a portion of the pedestal upper portion 11b, as a chip support portion 11c, partially supports the quantum chip 51). In the present example, a portion of the pedestal upper portion 11b is formed as the chip support portion 11c so as to support four corner portions of the rectangular quantum chip 51. Accordingly, because a metal surface of the pedestal 11 is not formed under the region other than the four corner portions of the quantum chip 51, formation of a capacitor with the metal surface of the pedestal 11 and the superconductor formed in the quantum chip 51 is inhibited.

Note that the pedestal bottom portion 11a and the pedestal upper portion 11b may integrally be formed with one member.

The suction tube 13 is configured to be attachable to and detachable from the pedestal 11. In a state where the suction tube 13 is mounted on the pedestal 11, the suction tube 13 is mounted such that a suction opening (opening portion) is positioned in a bottom surface of the quantum chip 51 from a bottom surface of the pedestal 11 to the recess portion 12 via the through hole of the pedestal bottom portion 11a and in the recess portion 12. Note that the suction tube 13 is configured with the same metal material as the pedestal 11, for example.

For example, when the quantum chip 51 is housed in the holder 1, the suction tube 13 is mounted on the pedestal 11. Subsequently, when the quantum chip 51 is arranged on the upper surface of the pedestal 11, suction (vacuum drawing) of the quantum chip 51 is performed via the suction tube 13, and the quantum chip 51 is thereby adhered to the suction opening of the suction tube 13. Accordingly, not only the four corner portions of the quantum chip 51 are supported by the chip support portion 11c, but also the quantum chip 51 is fixed by adhesion by the suction tube 13. Thus, wire bonding between a signal line of the quantum chip 51 and the waveguide of the PCB 52 can be conducted in a state where stability of the quantum chip 51 is secured.

After housing of the quantum chip 51 in the holder 1 (after wire bonding), the suction tube 13 is removed from the pedestal 11. Accordingly, not only formation of a capacitor with the metal surface of the pedestal 11 and the superconductor formed in the quantum chip 51 is inhibited, but also formation of a capacitor with the metal material configuring the suction tube 13 and the superconductor formed in the quantum chip 51 is inhibited. Accordingly, because a decrease of an internal Q factor due to the dielectric loss and an occurrence of box resonance are inhibited, circuit characteristics of the quantum chip 51 during measurement are improved. Note that after the suction tube 13 is removed, the quantum chip 51 is supported by the chip support portion 11c and bonding wires 53.

Manufacturing Method of Quantum Device 100

Figure 2:
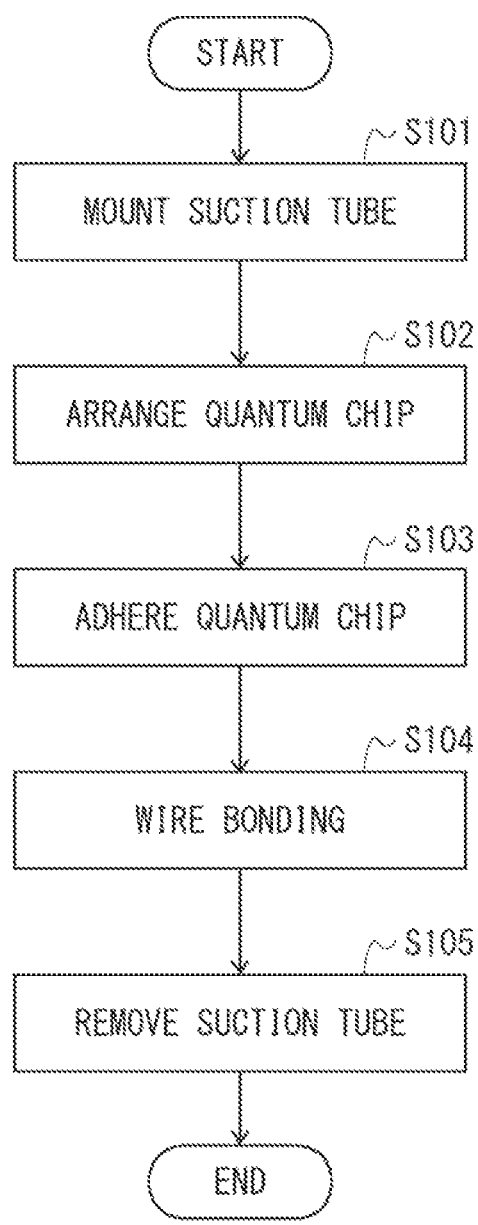
FIG. 2 is a flowchart illustrating a manufacturing method of a quantum device using the holder illustrated in FIG. 1.
Figure 3:
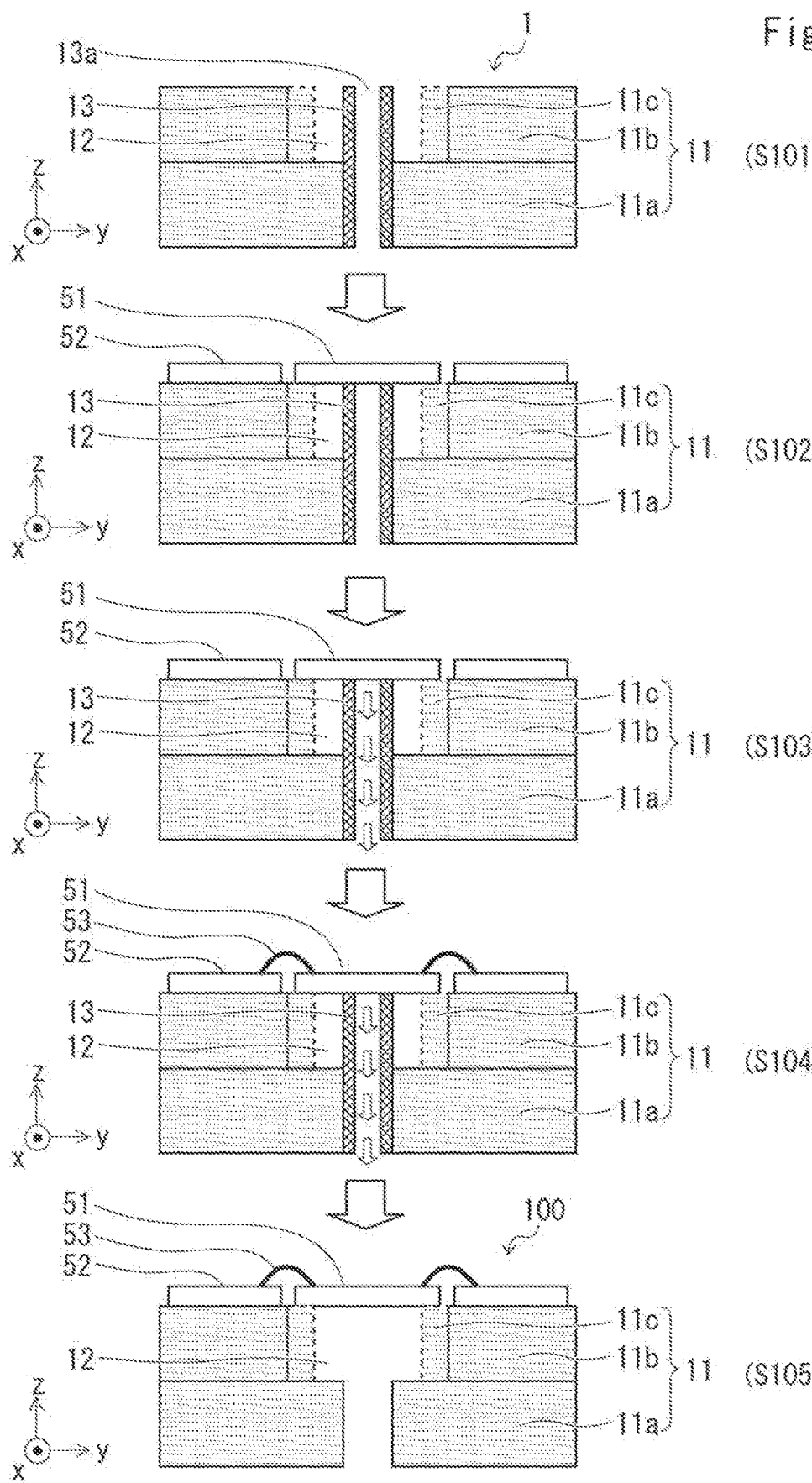
FIG. 3 is an outline cross-sectional view for explaining the manufacturing method of the quantum device using the holder illustrated in FIG. 1.

Next, a manufacturing method of a quantum device 100 using the holder 1 will be described by using FIG. 2 and FIG. 3. FIG. 2 is a flowchart illustrating the manufacturing method of the quantum device 100 using the holder 1. FIG. 3 is an outline cross-sectional view for explaining the manufacturing method of the quantum device 100 using the holder 1.

First, the suction tube 13 is mounted on the holder 1 (step S101). Note that in this case, the suction tube 13 is mounted such that a suction opening 13a is positioned in the bottom surface of the quantum chip 51 from the bottom surface of the pedestal 11 to the recess portion 12 via the through hole of the pedestal bottom portion 11a and in the recess portion 12.

Subsequently, the quantum chip 51 is arranged on the upper surface of the pedestal 11 so as to be opposed to the recess portion 12 (step S102). Further, the PCB 52 including the waveguide is arranged in a peripheral region of the quantum chip 51. Note that instead of the PCB 52 including the waveguide, the waveguide may directly be arranged.

Subsequently, suction of the quantum chip 51 is performed via the suction tube 13, and the quantum chip 51 is thereby adhered to the suction opening 13a of the suction tube 13 (step S103). Then, the signal line of the quantum chip 51 and the waveguide of the PCB 52 are connected together by the bonding wire 53 (step S104). Here, not only the four corner portions of the quantum chip 51 are supported by the chip support portion 11c, but also the quantum chip 51 is fixed by adhesion by the suction tube 13. Thus, wire bonding between the signal line of the quantum chip 51 and the waveguide of the PCB 52 can be conducted in a state where stability of the quantum chip 51 is secured.

After wire bonding (that is, after housing of the quantum chip 51 in the holder 1), the suction tube 13 is removed from the holder 1 (step S105). Accordingly, not only formation of a capacitor with the metal surface of the pedestal 11 and the superconductor formed in the quantum chip 51 is inhibited, but also formation of a capacitor with the metal material configuring the suction tube 13 and the superconductor formed in the quantum chip 51 is inhibited. Accordingly, because a decrease of the internal Q factor due to the dielectric loss and an occurrence of box resonance are inhibited, the circuit characteristics of the quantum chip 51 during measurement are improved.

Through such procedures, the quantum device 100 is manufactured which includes the quantum chip 51 and the holder 1 housing the quantum chip 51.

As described above, the holder 1 according to the present example embodiment includes the recess portion 12 that is formed in the main surface of the pedestal 11 so as to be opposed to the quantum chip 51 and the suction tube 13 that is detachably configured and is provided such that in the recess portion 12, the suction opening is positioned in the bottom surface of the quantum chip 51. Accordingly, because when the quantum chip 51 is housed in the holder 1, the quantum chip 51 can be fixed by adhesion by the suction tube 13, stability of the quantum chip 51 is improved. Further, after housing of the quantum chip 51 in the holder 1, the suction tube 13 is removed from the holder 1, formation of a capacitor with the metal material configuring the suction tube 13 and the superconductor formed in the quantum chip 51 is thereby inhibited, and the circuit characteristics of the quantum chip 51 are thus improved. That is, the holder 1 according to the present example embodiment can improve quality of the quantum chip 51 while securing stability of the quantum chip 51 to be installed.

In the present example embodiment, a description is made about, as an example, a case where the signal line of the quantum chip 51 and the waveguide of the PCB 52 are connected together by the bonding wire 53; however, connection is not limited to this but may be made by using another component such as a probe pin, for example.

Note that the holder 1 may further be provided with a detachable support member for supporting the quantum chip 51. This support member may be removed and mounted together with the suction tube 13.

Second Example Embodiment

Figure 4:
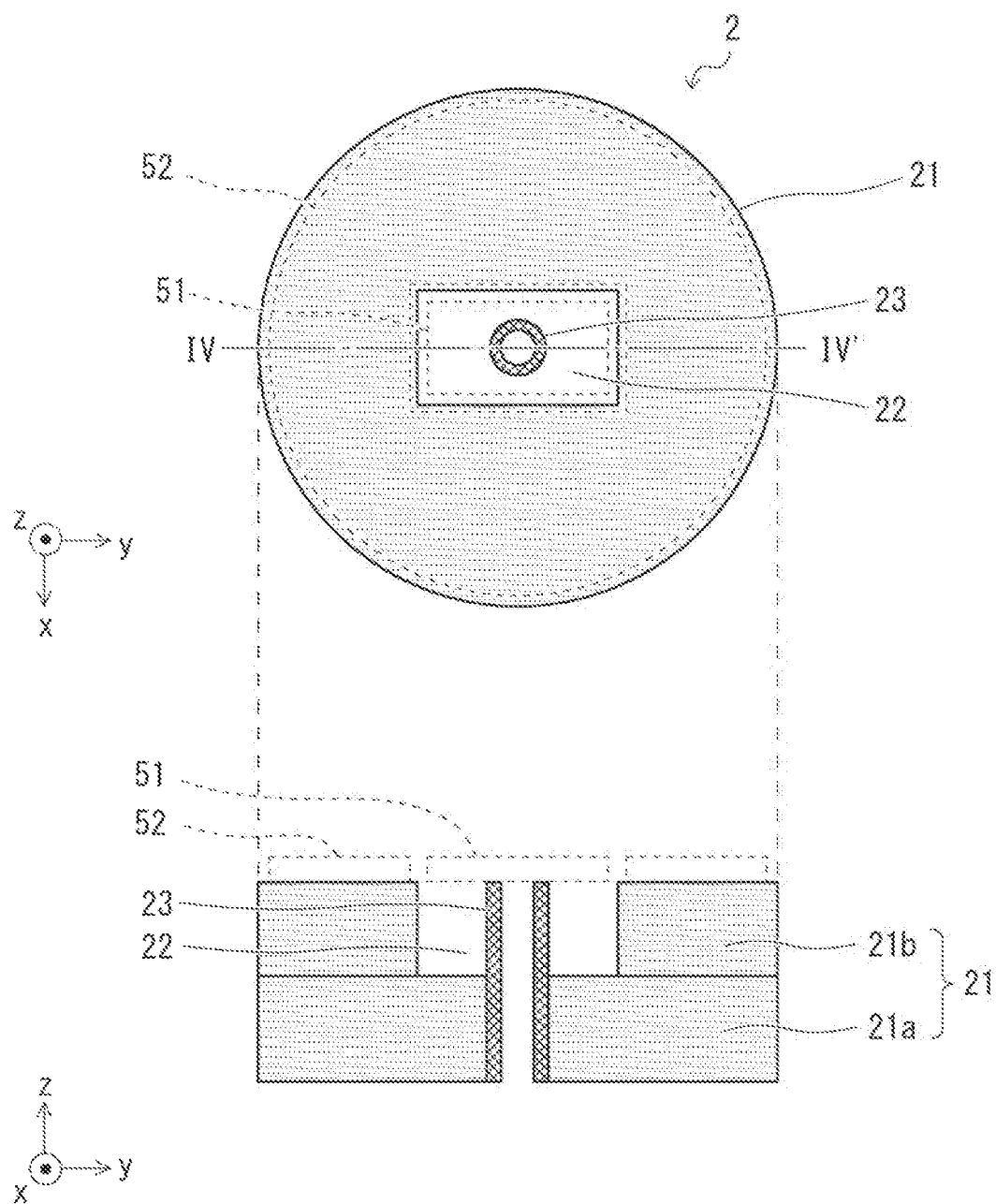
FIG. 4 is an outline planar view and an outline cross-sectional view that illustrate one example of a holder according to a second example embodiment.

FIG. 4 is an outline planar view and an outline cross-sectional view that illustrate one example of a holder 2 according to a second example embodiment. Note that the outline cross-sectional view in FIG. 4 is a cross section taken along a IV-IV' part in the outline planar view in FIG. 4 and seen from a lateral direction (x-axis direction).

As illustrated in FIG. 4, the holder 2 includes at least a pedestal 21 and a suction tube 23.

The pedestal 21 has a pedestal bottom portion 21a and a pedestal upper portion 21b. Note that the pedestal 21 and the suction tube 23 in the holder 2 respectively correspond to the pedestal 11 and the suction tube 13 in the holder 1. Further, the pedestal bottom portion 21a and the pedestal upper portion 21b in the pedestal 21 respectively correspond to the pedestal bottom portion 11a and the pedestal upper portion 11b in the pedestal 11.

Further, a counterbore treatment is applied to an arrangement region of the quantum chip 51 in an upper surface of the pedestal 21 (an upper surface of the pedestal upper portion 21b). In other words, a recess portion (space region) 22 in a recessed shape is formed in the arrangement region of the quantum chip 51 in the upper surface of the pedestal 21. Note that the recess portion 22 corresponds to the recess portion 12 in the holder 1.

Here, the recess portion 22 is formed such that in a planar view, a formation region of the recess portion 22 includes the whole arrangement region of the quantum chip 51. That is, in the pedestal upper portion 21b, the chip support portion 11c for supporting the quantum chip 51 is not formed. Accordingly, because a metal surface of the pedestal 21 is not formed under a region of the quantum chip 51, formation of a capacitor with the metal surface of the pedestal 21 and the superconductor formed in the quantum chip 51 is more inhibited than a case of the holder 1.

Note that the pedestal bottom portion 21a and the pedestal upper portion 21b may integrally be formed with one member.

The suction tube 23 is configured to be attachable to and detachable from the pedestal 21. In a state where the suction tube 23 is mounted on the pedestal 21, the suction tube 23 is mounted such that a suction opening is positioned in a bottom surface of the quantum chip 51 from a bottom surface of the pedestal 21 to the recess portion 22 via a through hole of the pedestal bottom portion 21a and in the recess portion 22. Note that the suction tube 23 is configured with the same metal material as the pedestal 21, for example.

For example, when the quantum chip 51 is housed in the holder 2, the suction tube 23 is mounted on the pedestal 21. Subsequently, when the quantum chip 51 is arranged on the upper surface of the pedestal 21, suction (vacuum drawing) of the quantum chip 51 is performed via the suction tube 23, and the quantum chip 51 is thereby adhered to the suction opening of the suction tube 23. Accordingly, the quantum chip 51 is fixed by adhesion by the suction tube 23. Thus, wire bonding between the signal line of the quantum chip 51 and the waveguide of the PCB 52 can be conducted in a state where stability of the quantum chip 51 is secured.

After housing of the quantum chip 51 in the holder 2 (after wire bonding), the suction tube 23 is removed from the pedestal 21. Accordingly, not only formation of a capacitor with the metal surface of the pedestal 21 and the superconductor formed in the quantum chip 51 is inhibited, but also formation of a capacitor with the metal material configuring the suction tube 23 and the superconductor formed in the quantum chip 51 is inhibited. Accordingly, because a decrease of the internal Q factor due to the dielectric loss and an occurrence of box resonance are inhibited, the circuit characteristics of the quantum chip 51 during measurement are improved. Note that after the suction tube 23 is removed, the quantum chip 51 is supported only by the bonding wires 53.

The other structures of the holder 2 are similar to the case of the holder 1, and descriptions thereof will thus not be repeated.

Manufacturing Method of Quantum Device 200

Figure 5:
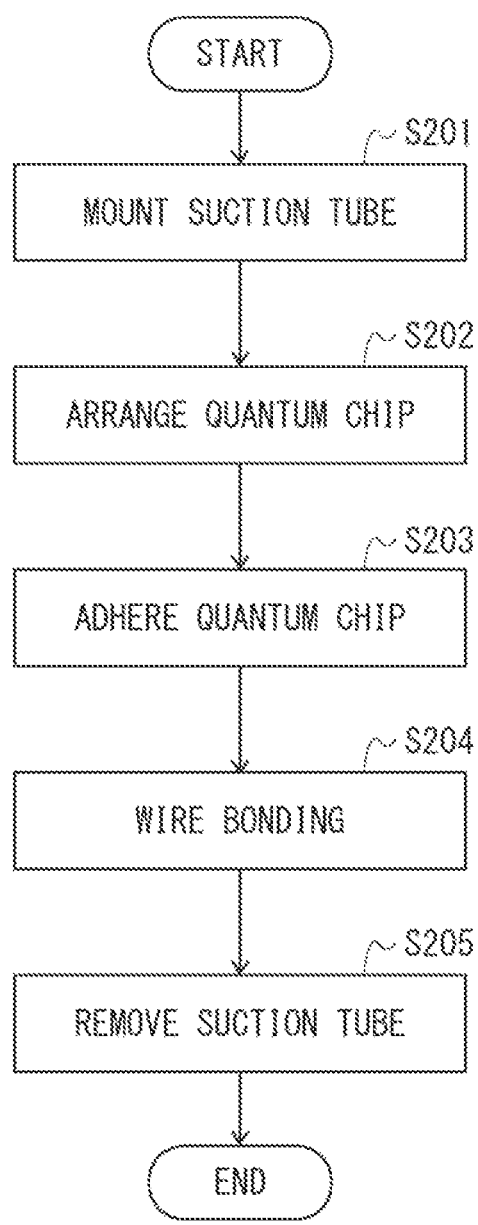
FIG. 5 is a flowchart illustrating a manufacturing method of a quantum device using the holder illustrated in FIG. 4.
Figure 6:
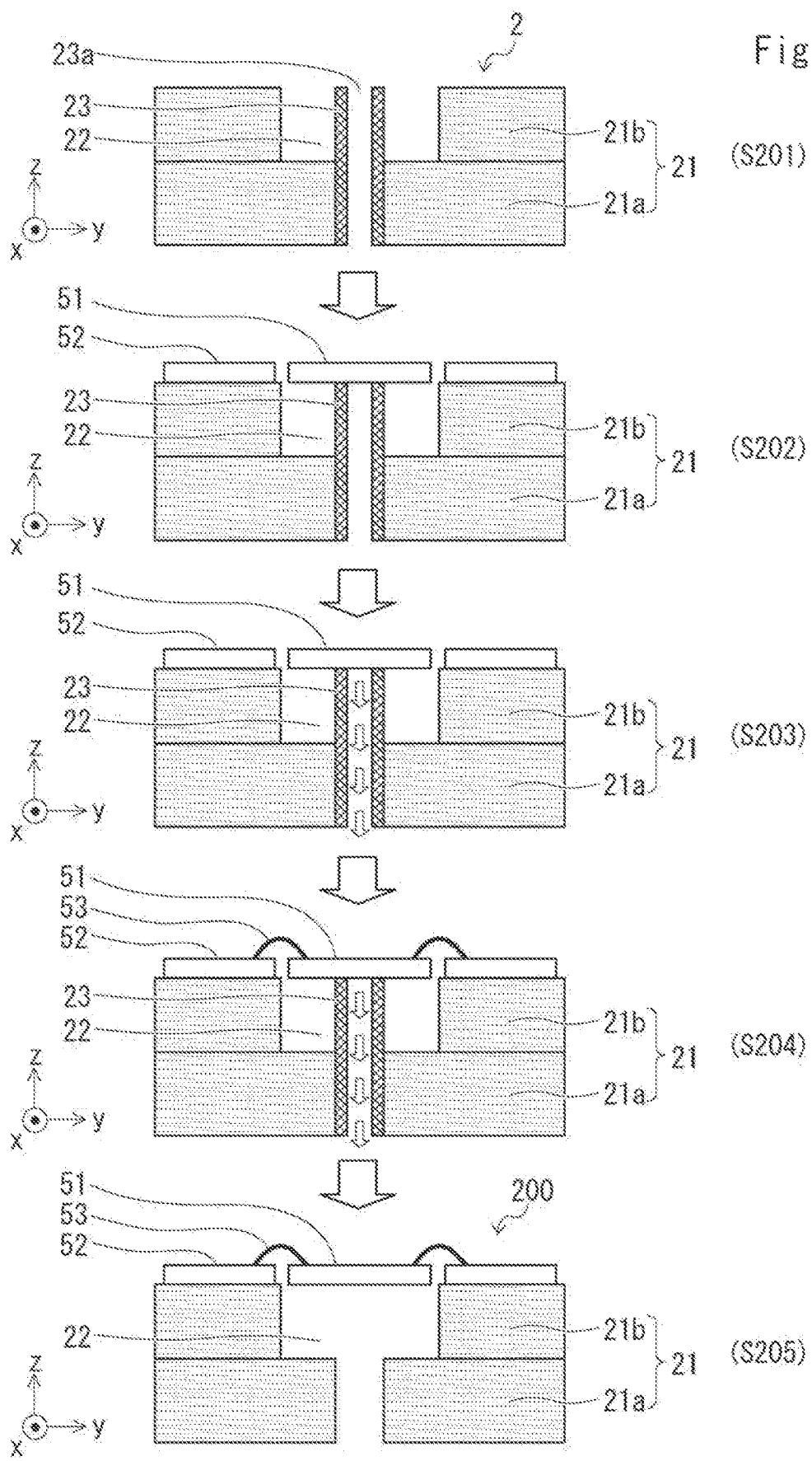
FIG. 6 is an outline cross-sectional view for explaining the manufacturing method of the quantum device using the holder illustrated in FIG. 4.

Next, a manufacturing method of a quantum device 200 using the holder 2 will be described by using FIG. 5 and FIG. 6. FIG. 5 is a flowchart illustrating the manufacturing method of the quantum device 200 using the holder 2. FIG. 6 is an outline cross-sectional view for explaining the manufacturing method of the quantum device 200 using the holder 2.

First, the suction tube 23 is mounted on the holder 2 (step S201). Note that in this case, the suction tube 23 is mounted such that a suction opening 23a is positioned in the bottom surface of the quantum chip 51 from the bottom surface of the pedestal 21 to the recess portion 22 via the through hole of the pedestal bottom portion 21a and in the recess portion 22.

Subsequently, the quantum chip 51 is arranged on the upper surface of the pedestal 21 so as to be opposed to the recess portion 22 (step S202). Further, the PCB 52 including the waveguide is arranged in a peripheral region of the quantum chip 51. Note that instead of the PCB 52 including the waveguide, the waveguide may directly be arranged.

Subsequently, suction of the quantum chip 51 is performed via the suction tube 23, and the quantum chip 51 is thereby adhered to the suction opening 23a of the suction tube 23 (step S203). Then, the signal line of the quantum chip 51 and the waveguide of the PCB 52 are connected together by the bonding wire 53 (step S204). Here, the quantum chip 51 is fixed by adhesion by the suction tube 23. Thus, wire bonding between the signal line of the quantum chip 51 and the waveguide of the PCB 52 can be conducted in a state where stability of the quantum chip 51 is secured.

After wire bonding (that is, after housing of the quantum chip 51 in the holder 2), the suction tube 23 is removed from the holder 2 (step S205). Accordingly, not only formation of a capacitor with the metal surface of the pedestal 21 and the superconductor formed in the quantum chip 51 is inhibited, but also formation of a capacitor with the metal material configuring the suction tube 23 and the superconductor formed in the quantum chip 51 is inhibited. Accordingly, because a decrease of the internal Q factor due to the dielectric loss and an occurrence of box resonance are inhibited, the circuit characteristics of the quantum chip 51 during measurement are improved. Note that after the suction tube 23 is removed, the quantum chip 51 is supported only by the bonding wires 53.

Through such procedures, the quantum device 200 is manufactured which includes the quantum chip 51 and the holder 2 housing the quantum chip 51.

As described above, the holder 2 according to the present example embodiment includes the recess portion 22 that is formed in the main surface of the pedestal 21 so as to be opposed to the quantum chip 51 and the suction tube 23 that is detachably configured and is provided such that in the recess portion 22, the suction opening is positioned in the bottom surface of the quantum chip 51. Accordingly, because when the quantum chip 51 is housed in the holder 2, the quantum chip 51 can be fixed by adhesion by the suction tube 23, stability of the quantum chip 51 is improved. Further, after housing of the quantum chip 51 in the holder 2, the suction tube 23 is removed from the holder 2, formation of a capacitor with the metal material configuring the suction tube 23 and the superconductor formed in the quantum chip 51 is thereby inhibited, and the circuit characteristics of the quantum chip 51 are thus improved. That is, the holder 2 according to the present example embodiment can improve quality of the quantum chip 51 while securing stability of the quantum chip 51 to be installed.

Note that the holder 2 may further be provided with a detachable support member for supporting the quantum chip 51. This support member may be removed and mounted together with the suction tube 23.

Third Example Embodiment

Figure 7:
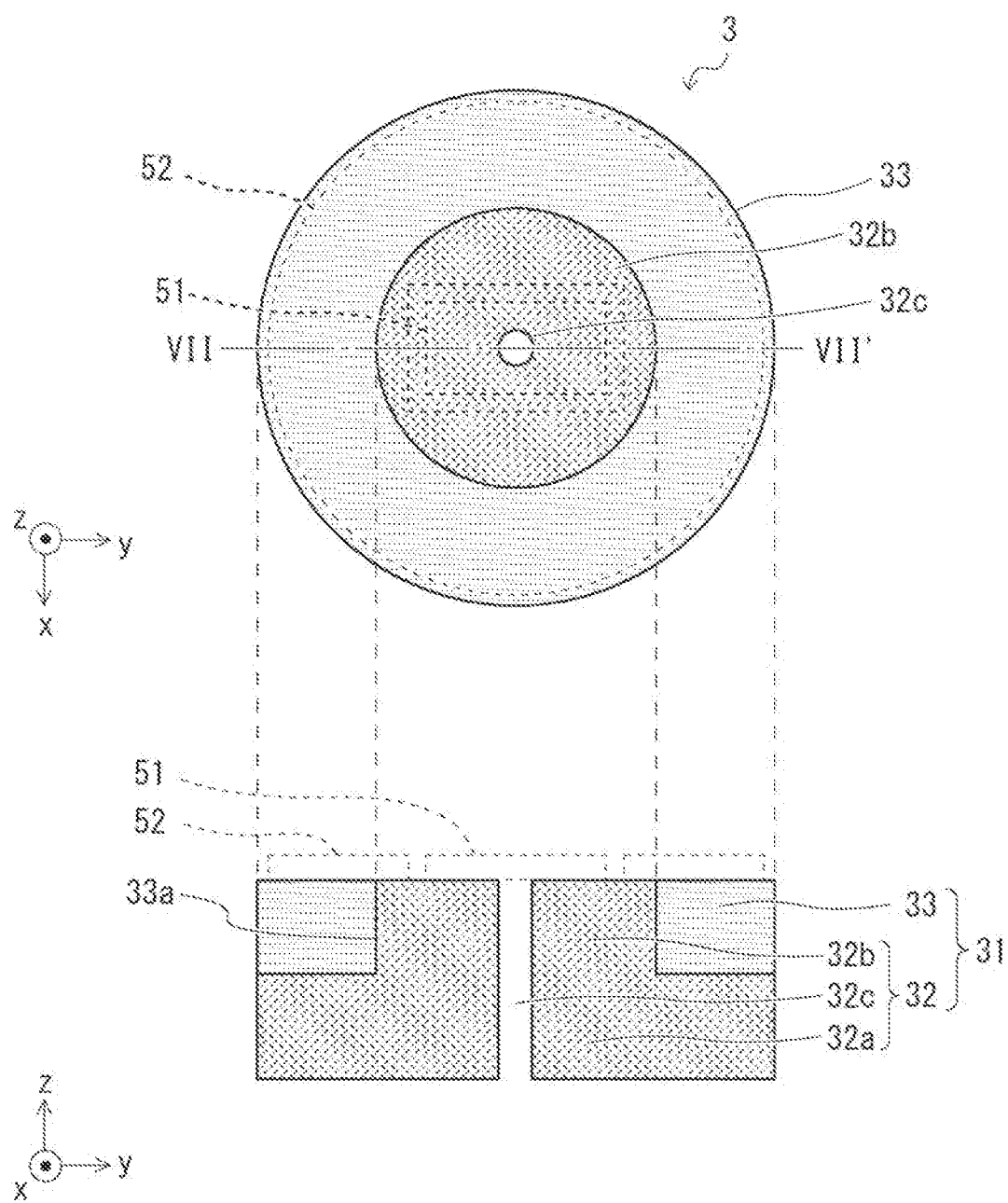
FIG. 7 is an outline planar view and an outline cross-sectional view that illustrate a first form of a holder according to a third example embodiment.
Figure 8:
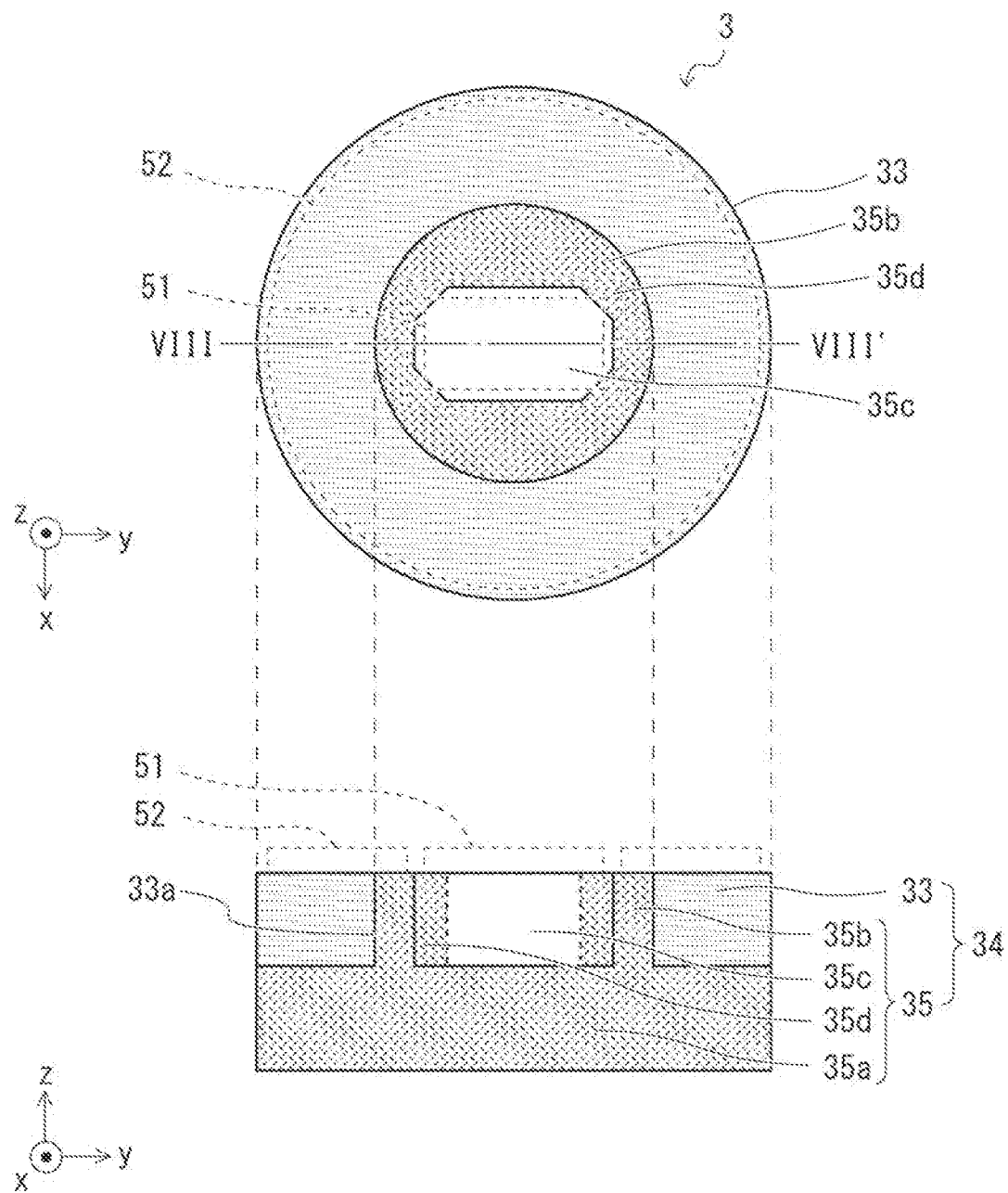
FIG. 8 is an outline planar view and an outline cross-sectional view that illustrate a second form of the holder according to the third example embodiment.

Next, a holder 3 according to a third example embodiment will be described. FIG. 7 is an outline planar view and an outline cross-sectional view that illustrate a first form of the holder 3 according to the third example embodiment. FIG. 8 is an outline planar view and an outline cross-sectional view that illustrate a second form of the holder 3 according to the third example embodiment. Note that the outline cross-sectional view in FIG. 7 is a cross section taken along a VII-VII' part in the outline planar view in FIG. 7 and seen from a lateral direction. Note that the outline cross-sectional view in FIG. 8 is a cross section taken along an VIII-VIII' part in the outline planar view in FIG. 8 and seen from a lateral direction. In the holder 3 according to the present example embodiment, a portion of a pedestal is configured in a replaceable manner. A detailed description will be made in the following.

First Form of Holder 3

First, the first form of the holder 3 will be described by using FIG. 7. Note that the first form of the holder 3 which is illustrated in FIG. 7 represents a holder structure at a time when the quantum chip 51 is housed.

As illustrated in FIG. 7, the first form of the holder 3 includes a pedestal 31 having a columnar shape whose axial direction is a perpendicular direction (z-axis direction). Specifically, the pedestal 31 is configured with a pedestal upper portion (pedestal body) 33 and a detachable pedestal bottom portion 32.

The pedestal upper portion 33 has a ring shape, and a space region 33a passing from a bottom surface to an upper surface is provided in a region including a central axis. The pedestal bottom portion 32 has a body portion 32a having a columnar shape whose axial direction is the perpendicular direction and a protrusion portion 32b formed so as to fit in the space region 33a of the pedestal upper portion 33 in an upper surface of the body portion 32a. Note that an upper surface of the protrusion portion 32b provided to the pedestal bottom portion 32 is a portion of an upper surface of the pedestal 31 and serves as a chip support portion supporting the quantum chip 51. Further, the pedestal bottom portion 32 is provided with a suction tube 32c passing from a bottom surface to the upper surface of the pedestal 31.

Second Form of Holder 3

Next, the second form of the holder 3 will be described by using FIG. 8. Note that the second form of the holder 3 which is illustrated in FIG. 8 represents a holder structure at a time after the quantum chip 51 is housed.

As illustrated in FIG. 8, the second form of the holder 3 includes a pedestal 34 having a columnar shape whose axial direction is the perpendicular direction, and a recess portion (space region) 35c in a recessed shape is in addition provided in an arrangement region of the quantum chip 51 in an upper surface of the pedestal 34.

Specifically, the pedestal 34 is configured with the pedestal upper portion 33 and a detachable pedestal bottom portion 35. Here, the pedestal 34 is the pedestal 31 in which the pedestal bottom portion 32 is replaced by the pedestal bottom portion 35.

The pedestal upper portion 33 has a ring shape as already described, and the space region 33a passing from the bottom surface to the upper surface is provided in the region including the central axis. The pedestal bottom portion 35 has a body portion 35a having a columnar shape whose axial direction is the perpendicular direction and a protrusion portion 35b formed so as to fit in the space region 33a of the pedestal upper portion 33 in an upper surface of the body portion 35a. In addition, a recess portion 35c in a recessed shape is provided in the arrangement region of the quantum chip 51 in an upper surface of the protrusion portion 35b.

The recess portion 35c is formed such that in a planar view, a formation region of the recess portion 35c does not include a portion of the arrangement region of the quantum chip 51 (in other words, such that a portion of the protrusion portion 35b of the pedestal bottom portion 35, as a chip support portion 35d, partially supports the quantum chip 51). In the present example, a portion of the protrusion portion 35b is formed as the chip support portion 35d so as to support the four corner portions of the rectangular quantum chip 51.

For example, when the quantum chip 51 is housed in the holder 3, the pedestal bottom portion 32 having the suction tube 32c is mounted on the pedestal upper portion 33 (that is, the pedestal 31 is used). Subsequently, when the quantum chip 51 is arranged on the upper surface of the pedestal 31, suction (vacuum drawing) of the quantum chip 51 is performed via the suction tube 32c, and the quantum chip 51 is thereby adhered to a suction opening of the suction tube 32c. Accordingly, the quantum chip 51 is not only supported by the protrusion portion 32b but also fixed by adhesion by the suction tube 32c. Thus, wire bonding between the signal line of the quantum chip 51 and the waveguide of the PCB 52 can be conducted in a state where stability of the quantum chip 51 is secured.

After housing of the quantum chip 51 in the holder 3 (after wire bonding), the pedestal bottom portion 35 having the recess portion 35c is mounted on the pedestal upper portion 33 (that is, the pedestal 34 is used). Accordingly, because the recess portion 35c is formed under a region of the quantum chip 51 and a metal surface of the pedestal 34 is not formed, formation of a capacitor with the metal surface of the pedestal 34 and the superconductor formed in the quantum chip 51 is inhibited. Accordingly, because a decrease of the internal Q factor due to the dielectric loss and an occurrence of box resonance are inhibited, the circuit characteristics of the quantum chip 51 during measurement are improved. Note that in this case, the quantum chip 51 is supported by the chip support portion 35d and the bonding wires 53.

Manufacturing Method of Quantum Device 300

Figure 9:
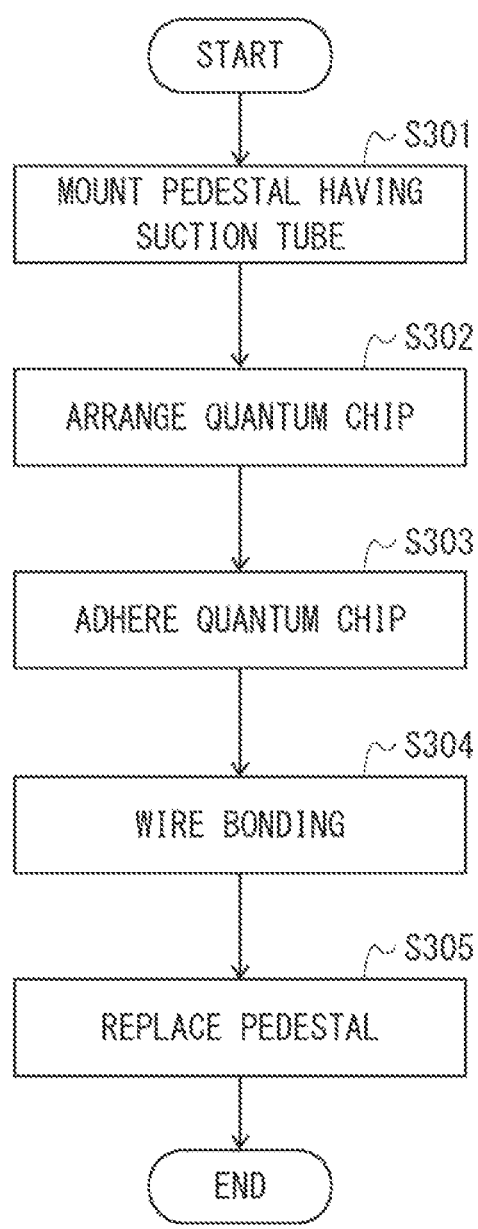
FIG. 9 is a flowchart illustrating a manufacturing method of a quantum device using the holder illustrated in FIG. 7 and FIG. 8.

Next, a manufacturing method of a quantum device 300 using the holder 3 will be described by using FIG. 9 and FIG.

Figure 10:
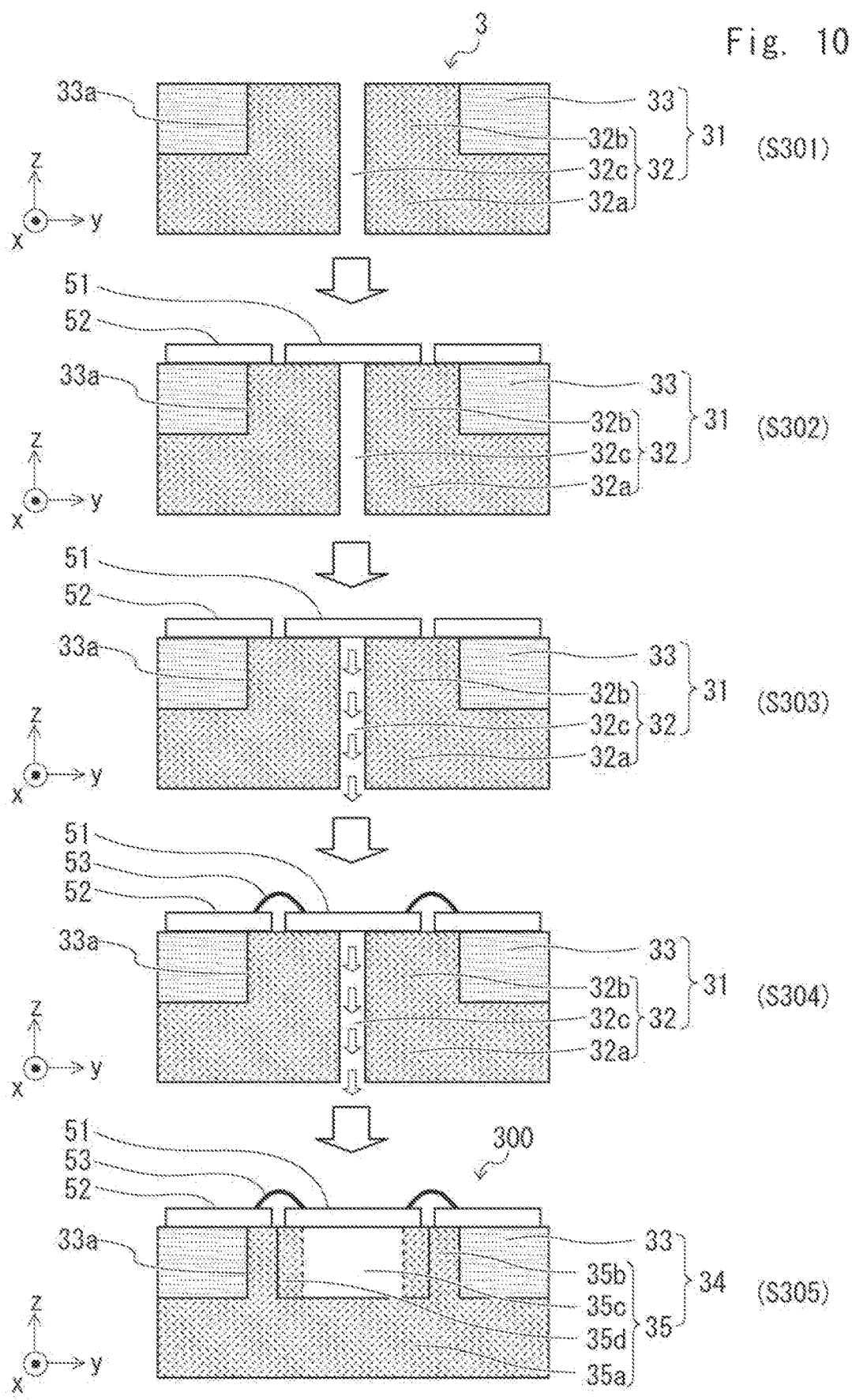
FIG. 10 is an outline cross-sectional view for explaining the manufacturing method of the quantum device using the holder illustrated in FIG. 7 and FIG. 8.

10. FIG. 9 is a flowchart illustrating the manufacturing method of the quantum device 300 using the holder 3. FIG. 10 is an outline cross-sectional view for explaining the manufacturing method of the quantum device 300 using the holder 3.

First, the pedestal bottom portion 32 having the suction tube 32c is mounted on the pedestal upper portion 33 of the holder 3 (step S301). That is, the pedestal 31 illustrated in FIG. 7 is prepared.

Subsequently, the quantum chip 51 is arranged on the upper surface of the pedestal 31 (step S302). Further, the PCB 52 including the waveguide is arranged in a peripheral region of the quantum chip 51. Note that instead of the PCB 52 including the waveguide, the waveguide may directly be arranged.

Subsequently, suction of the quantum chip 51 is performed via the suction tube 32c, and the quantum chip 51 is thereby adhered to the suction opening of the suction tube 32c (step S303). Then, the signal line of the quantum chip 51 and the waveguide of the PCB 52 are connected together by the bonding wire 53 (step S304). Here, the quantum chip 51 is not only supported by the chip support portion 35d but also fixed by adhesion by the suction tube 32c. Thus, wire bonding between the signal line of the quantum chip 51 and the waveguide of the PCB 52 can be conducted in a state where stability of the quantum chip 51 is secured.

After wire bonding (that is, after housing of the quantum chip 51 in the holder 3), instead of the pedestal bottom portion 32 having the suction tube 32c, the pedestal bottom portion 35 having the recess portion 35c is mounted on the pedestal upper portion 33 of the holder 3 (step S305). That is, the pedestal 34 illustrated in FIG. 8 is prepared.

Accordingly, because the recess portion 35c is formed under a region of the quantum chip 51 and a metal surface of the pedestal 34 is not formed, formation of a capacitor with the metal surface of the pedestal 34 and the superconductor formed in the quantum chip 51 is inhibited. Accordingly, because a decrease of the internal Q factor due to the dielectric loss and an occurrence of box resonance are inhibited, the circuit characteristics of the quantum chip 51 during measurement are improved. Note that in this case, the quantum chip 51 is supported by the chip support portion 35d and the bonding wires 53.

Through such procedures, the quantum device 300 is manufactured which includes the quantum chip 51 and the holder 3 housing the quantum chip 51.

As described above, in the holder 3 according to the present example embodiment, the pedestal is configured such that the pedestal bottom portion 32 (first pedestal component) having the suction tube 32c is capable of being exchanged for the pedestal bottom portion 35 (second pedestal component) having the recess 35c. Accordingly, because when the quantum chip 51 is housed in the holder 3, the quantum chip 51 can be fixed by adhesion by the suction tube 32c, stability of the quantum chip 51 is improved. Further, after housing of the quantum chip 51 in the holder 3, the recess portion 35c (space region) is provided under the region of the quantum chip 51, formation of a capacitor with a metal surface of the pedestal and the superconductor formed in the quantum chip 51 is thereby inhibited, and the circuit characteristics of the quantum chip 51 are thus improved. That is, the holder 3 according to the present example embodiment can improve quality of the quantum chip 51 while securing stability of the quantum chip 51 to be installed.

Modification Example of Second Form of Holder 3

Figure 11:
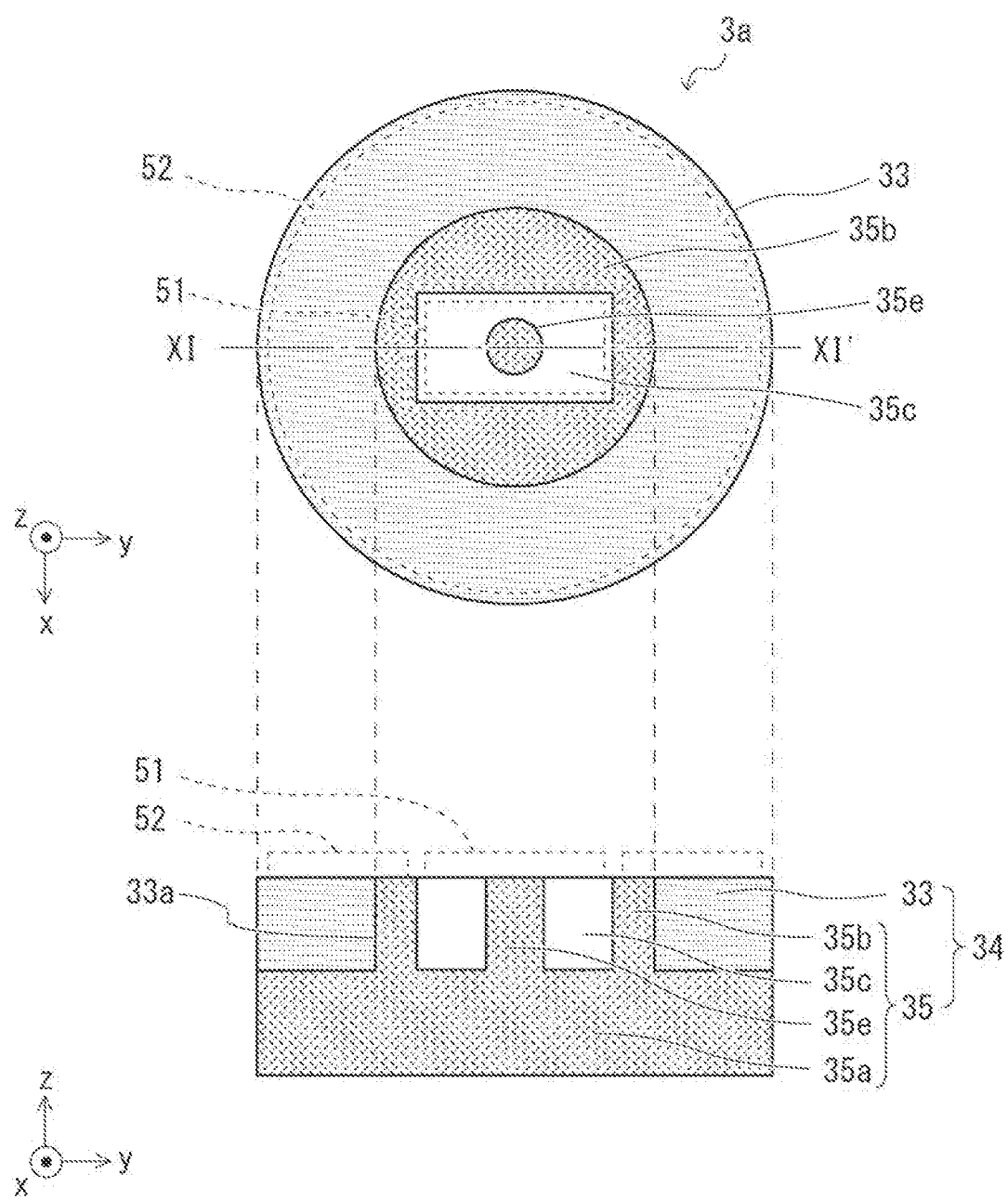
FIG. 11 is an outline planar view and an outline cross-sectional view that illustrate a modification example of the holder illustrated in FIG. 8.

FIG. 11 is an outline planar view and an outline cross-sectional view that illustrate, as a holder 3a, a modification example of the second form of the holder 3 illustrated in FIG. 8. Note that the outline cross-sectional view in FIG. 11 is a cross section taken along an XI-XI' part in the outline planar view in FIG. 11 and seen from a lateral direction.

As illustrated in FIG. 11, in the holder 3a, instead of the chip support portion 35d supporting the four corner portions of the quantum chip 51, a chip support portion 35e in a columnar shape is provided which supports a central portion of the quantum chip 51. The other structures of the holder 3a illustrated in FIG. 11 are similar to structures of the holder 3 illustrated in FIG. 8, and descriptions thereof will thus not be repeated.

As described above, the chip support portion is capable of being appropriately changed within a range in which the chip support portion can support the quantum chip 51.

In the foregoing, the example embodiments of the present disclosure have been described in detail with reference to the drawings; however, specific configurations are not limited to the above-described configurations, and various design changes and so forth are possible without departing from the scope of the gist of the present disclosure.

For example, to each of the above-described holders, a chip support portion which is asymmetrical in a planar view may be provided in addition. Accordingly, an occurrence of highly symmetrical box resonance is inhibited. As a result, the circuit characteristics of the quantum chip 51 are improved, and cooling performance of the quantum chip 51 is also improved.

Further, a whole shape of the pedestal is not limited to a columnar shape but may be another shape such as a long columnar shape, an elliptic column shape, or a polygonal shape. Similarly, a shape of the suction tube is not limited to a cylindrical shape but may be another tubular shape.

A portion or all of the above-described example embodiments may be described as the following supplementary notes but are not limited to the following.

(Supplementary Note 1)
A quantum device comprising:
a quantum chip; and
a holder, wherein
the holder includes:
a pedestal;
a recess portion formed in a main surface of the pedestal so as to be opposed to the quantum chip; and
a tube provided such that in the recess portion, an opening portion is positioned in a bottom surface of the quantum chip.

(Supplementary Note 2)
The quantum device according to the supplementary note 1, wherein the tube is configured to be attachable to and detachable from the pedestal.

(Supplementary Note 3)
The quantum device according to the supplementary note 1 or 2, further comprising:
a waveguide arranged in the pedestal; and
a bonding wire connecting the quantum chip and the waveguide together.

(Supplementary Note 4)
The quantum device according to the supplementary note 3, wherein the recess portion is formed so as to include a whole arrangement region of the quantum chip in a planar view.

(Supplementary Note 5)
The quantum device according to any one of the supplementary notes 1 to 3, wherein the recess portion is formed such that a portion of the pedestal supports the quantum chip.

(Supplementary Note 6)

The quantum device according to any one of the supplementary notes 1 to 5, wherein at least a portion of the quantum chip is configured with a superconductor material.

(Supplementary Note 7)

A holder comprising:
a pedestal;
a recess portion formed in a main surface of the pedestal so as to be opposed to a quantum chip; and
a tube provided such that in the recess portion, an opening portion is positioned in a bottom surface of the quantum chip.

(Supplementary Note 8)

The holder according to the supplementary note 7, wherein the tube is configured to be attachable to and detachable from the pedestal.

(Supplementary Note 9)

A manufacturing method of a quantum device, the method comprising:
a step of mounting a suction tube on a pedestal such that a suction opening is positioned in a bottom surface of a quantum chip in a recess portion formed in a main surface of the pedestal;
a step of arranging the quantum chip on a main surface of the pedestal such that the quantum chip is opposed to the recess portion;
a step of performing suction of the quantum chip via the suction tube to adhere the quantum chip to the suction opening of the suction tube;
a step of electrically connecting a signal line of the quantum chip with a waveguide arranged in the pedestal; and
a step of removing the suction tube from the pedestal.

(Supplementary Note 10)

The manufacturing method of a quantum device according to the supplementary note 9, wherein in the step of electrically connecting the signal line of the quantum chip with the waveguide arranged in the pedestal, the signal line of the quantum chip is connected with the waveguide arranged in the pedestal by a bonding wire.

(Supplementary Note 11)

The manufacturing method of a quantum device according to the supplementary note 10, wherein the recess portion is formed so as to include a whole arrangement region of the quantum chip in a planar view.

(Supplementary Note 12)

The manufacturing method of a quantum device according to the supplementary note 9 or 10, wherein the recess portion is formed such that a portion of the pedestal supports the quantum chip.

(Supplementary Note 13)

A quantum device comprising:
a quantum chip; and
a holder having a pedestal,
wherein the pedestal includes:
a pedestal body;
a first pedestal component configured to be attachable to and detachable from the pedestal body and having a tube formed such that an opening portion is positioned in a bottom surface of the quantum chip in a case where the tube is mounted on the pedestal body; and
a second pedestal component configured to be capable of being replaced by the first pedestal component and having a recess portion formed so as to be opposed to the quantum chip in a case where the second pedestal component is mounted on the pedestal body.

(Supplementary Note 14)

The quantum device according to the supplementary note 13, further comprising:
a waveguide arranged in the pedestal; and
a bonding wire connecting the quantum chip and the waveguide together.

(Supplementary Note 15)

The quantum device according to the supplementary note 14, wherein the recess portion is formed so as to include a whole arrangement region of the quantum chip in a planar view.

(Supplementary Note 16)

The quantum device according to the supplementary note 13 or 14, wherein the recess portion is formed such that a portion of the pedestal supports the quantum chip.

(Supplementary Note 17)

The quantum device according to any one of the supplementary notes 13 to 16, wherein at least a portion of the quantum chip is configured with a superconductor material.

(Supplementary Note 18)

A holder comprising
a pedestal,
wherein the pedestal includes:
a pedestal body;
a first pedestal component configured to be attachable to and detachable from the pedestal body and having a tube formed such that an opening portion is positioned in a bottom surface of the quantum chip in a case where the tube is mounted on the pedestal body; and
a second pedestal component configured to be capable of being replaced by the first pedestal component and having a recess portion formed so as to be opposed to the quantum chip in a case where the second pedestal component is mounted on the pedestal body.

(Supplementary Note 19)

A manufacturing method of a quantum device, the method comprising:
a step of mounting a first pedestal component having a suction tube on a pedestal body of a pedestal such that a suction opening of the suction tube is positioned in a bottom surface of the quantum chip;
a step of arranging the quantum chip in the pedestal;
a step of performing suction of the quantum chip via the suction tube to adhere the quantum chip to the suction opening of the suction tube;
a step of electrically connecting a signal line of the quantum chip with a waveguide arranged in the pedestal;
a step of removing the first pedestal component from the pedestal body of the pedestal; and
a step of mounting a second pedestal component having a recess portion on the pedestal body of the pedestal such that the recess portion is opposed to the quantum chip.

(Supplementary Note 20)

The manufacturing method of a quantum device according to the supplementary note 19, wherein in the step of electrically connecting the signal line of the quantum chip with the waveguide arranged in the pedestal, the signal line of the quantum chip is connected with the waveguide arranged in the pedestal by a bonding wire.

(Supplementary Note 21)

The manufacturing method of a quantum device according to the supplementary note 20, wherein the recess portion is formed so as to include a whole arrangement region of the quantum chip in a planar view.

(Supplementary Note 22)

The manufacturing method of a quantum device according to the supplementary note 19 or 20, wherein the recess portion is formed such that a portion of the pedestal supports the quantum chip.

Each of the above example embodiments can provide a holder, a quantum device, a manufacturing method of a quantum device that are capable of improving quality of a quantum chip while securing stability of a quantum chip to be installed.

The first to third embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A quantum device comprising:
   a quantum chip; and
   a holder having a pedestal,
   wherein the pedestal includes:
   a pedestal body;
   a first pedestal component configured to be attachable to and detachable from the pedestal body and having a tube formed such that an opening portion is positioned in a bottom surface of the quantum chip in a case where the tube is mounted on the pedestal body; and
   a second pedestal component configured to be capable of being replaced by the first pedestal component and having a recess portion formed so as to be opposed to the quantum chip in a case where the second pedestal component is mounted on a pedestal body.

2. The quantum device according to claim 1, further comprising:
   a waveguide arranged in the pedestal; and
   a bonding wire connecting the quantum chip and the waveguide together.

3. The quantum device according to claim 2, wherein the recess portion is formed so as to include a whole arrangement region of the quantum chip in a planar view.

4. The quantum device according to claim 1, wherein the recess portion is formed such that a portion of the pedestal supports the quantum chip.

* * * * *